(12) United States Patent
Park et al.

(10) Patent No.: US 7,260,013 B2
(45) Date of Patent: Aug. 21, 2007

(54) POWER SUPPLY DEVICE IN SEMICONDUCTOR MEMORY

(75) Inventors: Bok-Gue Park, Suwon-si (KR); Woo-Seop Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 11/001,974

(22) Filed: Dec. 2, 2004

(65) Prior Publication Data

US 2005/0122819 A1    Jun. 9, 2005

(30) Foreign Application Priority Data

Dec. 3, 2003    (KR) .................... 10-2003-0087140

(51) Int. Cl.
*G11C 5/14* (2006.01)
*G11C 7/00* (2006.01)
*G11C 8/00* (2006.01)
*G05F 1/10* (2006.01)

(52) U.S. Cl. .................. 365/226; 365/191; 365/222; 365/233; 365/236; 323/241; 323/244

(58) Field of Classification Search ............... 365/226, 365/222; 323/241
See application file for complete search history.

(56) References Cited

U.S. PATENT DOCUMENTS

| 5,586,613 | A * | 12/1996 | Ehsani | 180/65.2 |
| 6,252,783 | B1 * | 6/2001 | Huh et al. | 363/21.01 |
| 6,343,044 | B1 | 1/2002 | Hsu et al. | 365/227 |
| 6,414,289 | B1 * | 7/2002 | Lee et al. | 219/757 |
| 6,498,760 | B2 * | 12/2002 | Yamasaki | 365/226 |
| 6,597,617 | B2 * | 7/2003 | Ooishi et al. | 365/222 |
| 6,661,215 | B2 * | 12/2003 | Asami | 323/281 |
| 6,731,586 | B2 * | 5/2004 | Seo et al. | 369/116 |
| 6,765,432 | B2 * | 7/2004 | Mitsui | 327/544 |
| 6,930,948 | B2 * | 8/2005 | Lee et al. | 365/226 |
| 6,934,210 | B2 * | 8/2005 | Akiba et al. | 365/222 |
| 2002/0064079 | A1 | 5/2002 | Sato et al. | 365/227 |
| 2002/0105845 | A1 | 8/2002 | Hidaka | 365/222 |
| 2002/0120811 | A1 * | 8/2002 | Maeda | 711/105 |
| 2003/0063512 | A1 * | 4/2003 | Takahashi et al. | 365/222 |
| 2003/0081461 | A1 * | 5/2003 | Yamauchi et al. | 365/189.09 |
| 2004/0017719 | A1 * | 1/2004 | Bell | 365/222 |
| 2005/0122819 | A1 * | 6/2005 | Park et al. | 365/226 |

FOREIGN PATENT DOCUMENTS

| JP | 2002233181 A | * | 8/2002 |
| KR | 2000-0043211 | | 7/2000 |
| KR | 1020030004692 | | 1/2003 |
| KR | 2003-0036860 | | 5/2003 |

* cited by examiner

*Primary Examiner*—Amir Zarabian
*Assistant Examiner*—Ly D Pham
(74) *Attorney, Agent, or Firm*—Mills & Onello LLP

(57) ABSTRACT

A power supply device in a semiconductor memory includes a power control means and a power generation means. The power control means divides a self-refresh section into an active-precharge mode and an idle mode depending on an operation characteristic of the semiconductor memory, and generates a control signal for controlling power strength applied to the semiconductor memory during operation in each mode. The power generation mode generates a different power level in response to a power control signal from the power control means to provide to the semiconductor memory. Meanwhile, the power supply device according to the present invention provides relatively strong power to the semiconductor memory a predetermined time period in advance of the active-precharge mode.

33 Claims, 5 Drawing Sheets

POWER SUPPLY DEVICE IN SEMICONDUCTOR MEMORY

RELATED APPLICATION

This application relies for priority upon Korean Patent Application No. 2003-87140, filed on Dec. 3, 2003, the contents of which are herein incorporated by reference in their entirety.

FIELD OF THE INVENTION

The present invention relates to power supply devices operable in semiconductor memory devices such as a DRAM (Dynamic Random Access Memory). More specifically, the present invention is directed to power supply devices capable of efficiently controlling power supplied to semiconductor memories during the self-refresh operation of the DRAM.

BACKGROUND OF THE INVENTION

In the rapidly developing field of portable devices, it is an important consideration to minimize power dissipation, in order to extend the time period of portability. Accordingly, various devices and methods have been developed to reduce power dissipation in portable devices.

The increasing use of DRAM (Dynamic Random Access Memory) in portable devices has highlighted the need for reducing power dissipation in the DRAM. Recently, several design methods of the DRAM have been actively investigated in order to reduce power dissipation in the refresh operation of the DRAM.

Refresh operations involve a series of operations that maintain data in semiconductor memories such as the DRAM. Generally, DRAM devices employ capacitors as the basic storage cell structures and DRAM devices determine the status of data according to whether charge is stored in a given capacitor cell. However, as time passes, charge that is stored in a capacitor becomes gradually discharged as a result of leakage current, thereby resulting in eventual data loss. To prevent this problem, data is preserved in the DRAM by periodically recharging the capacitor cells. This operation is referred to as a refresh operation.

A refresh operation is performed as follows. Data in the cells are read and amplified and then the data are restored in the original cells. One example of the refresh operation is a self-refresh. In a self-refresh operation, a refresh operation is performed without an external refresh command at a regular periodic interval while the DRAM is in a long-time waiting mode or in a low-power consumption mode. In the self-refresh operation, the refresh operation is continuously performed until an externally generated refresh end command is received.

Meanwhile, power supply devices provide the DRAM device with a direct current voltage level required to perform the DRAM operations. However, as mentioned above, the self-refresh operation is performed while operating in a mode when data input/output operations are not performed (e.g., in a long-time waiting mode or in a low-power mode), and therefore offers the advantage of relatively low power consumption as compared to normal operating mode. Therefore, the DRAM power supply device provides relatively weaker power levels during the refresh mode as compared to normal mode. In this manner, power consumption by the DRAM is reduced.

FIG. 1 illustrates the input and output signals for a self-refresh operation in a general power supply device used in conventional semiconductor memory. FIG. 2 is a waveform diagram of signals of the conventional power supply device shown in FIG. 1.

Referring to FIGS. 1 and 2, a conventional power supply device 100 continuously provides relatively weak power levels to a DRAM during a self-refresh operation section (an SR section A) as compared to a normal operation section in response to a self-refresh clock signal $P_{self}$ input from an external source and a predetermined reference voltage $V_{ref}$. At this time, the power supply device 100 may be embodied to include a differential amplifier (not shown). This is understood by those skilled in the art, and description thereof is thus omitted.

In another approach, as shown the waveform diagram of FIG. 2, the DRAM self-refresh operation may be subdivided into an active-precharge mode B and an idle mode C during the SR section A. In the active-precharge mode B, an actual refresh operation is performed. For this reason, the active-precharge mode B requires relatively strong power as compared to the idle mode C being a waiting state. However, the power that is supplied to the power supply device 100 controlled by the self-refresh clock signal $P_{self}$ during the SR section A is relatively weak as compared to the normal operation section. As a result, the possibility exists that the power provided for the active-precharge mode of the self-refresh operation is insufficient. In addition, unnecessary power is consumed during the idle mode C.

SUMMARY OF THE INVENTION

It is a feature of the present invention to provide a power supply device capable of efficiently controlling power output during each mode of operation of a memory device by subdividing a self-refresh section of a DRAM into a plurality of modes according to operation characteristics.

In one aspect, the present invention is directed to a power supply device. A power control unit generates a power control signal so as to control an output power of the power supply device in response to an operation mode of an external device. A power generation unit generates a first power level or a second power level that is less than the first power level, in response to the power control signal, to provide power to the external device, wherein the first power level is provided to the external device in advance of the external device entering a first mode that requires the first power level.

In one embodiment, the power control unit comprises: an internal clock generation unit for generating an internal clock signal having a regular period during an operation section of the external device including the first mode of operation and a second mode of operation; a counter unit for generating first, second, third and fourth clock signals in response to the internal clock signal; a mode control unit for generating a mode signal for partitioning the operation section into the first mode and the second mode in response to the fourth clock signal; and a power control unit for generating the power control signal in response to the internal clock signal, the first, second, and third clock signals and the mode signal.

In another embodiment, the counter unit divides the internal clock signal, the first clock signal, the second clock signal and the third clock signal to generate the first clock signal, the second clock signal, the third clock signal and the fourth clock signal, respectively. For example, the counter unit divides-by-two the internal clock signal and the first, second and third clock signals.

In another embodiment, the first power level is provided to the external device before the external device enters into the first mode of operation, and the second power level is provided to the external device during the second mode of operation.

In another embodiment, when an operation mode of the external device begins, the mode control unit generates a pulse signal, and the mode control unit generates the pulse signal in response to the fourth clock signal to generate the mode signal. The external device operates in the first mode of operation during a section where the pulse signal is activated. In another embodiment, the first power is output when the internal clock signal and the first, second and third clock signals are all active, or if the pulse signal is active.

In another embodiment, the power control unit comprises an AND gate for receiving the internal clock signal and the first, second and third clock signals; and a NOR gate for receiving an output of the AND gate and the pulse signal to generate the power control signal.

In another embodiment, the power generation unit comprises: a comparator for comparing a reference voltage input from an external source to generate at a voltage level that is the same as that of the reference voltage; and a control unit connected between the comparator and a ground voltage, the control unit for controlling an operation speed of the comparator in response to the power control signal. The power generation unit may comprise a differential amplifier.

In another embodiment, the control unit comprises: a plurality of NMOS transistors connected in series between the comparator and the ground voltage; and a resistance controller for bypassing a subset of the plurality of NMOS transistors, in response to the power control signal. The resistance controller comprises: an inverter for inverting the power control signal; and an NMOS transistor that is activated in response to an output of the inverter.

In another aspect, the present invention is directed to a power supply device of a semiconductor memory. A power control unit generates a power control signal for designating an operation of the semiconductor memory into a first mode and a second mode depending on a power dissipation characteristic. The power control unit controls a power level supplied to the semiconductor memory in each of the first mode and the second mode, wherein operation in the first mode is relatively more conservative than operation in the second mode in an amount of power dissipation. A power generation unit generates a first power level or a second power level that is less than the first power level, in response to the power control signal to provide power to the semiconductor memory, wherein the first power level is provided to the semiconductor memory in advance of the semiconductor memory entering the first mode.

In another aspect, the present invention is directed to a power supply device of a semiconductor memory for performing a self-refresh operation. A power control unit designates the self-refresh operation into a first mode of operation and a second mode of operation. The power control unit generates a power control signal to control power level supplied to the semiconductor memory in each of the first mode and the second mode. An active-precharge operation of a refresh operation is performed in the first mode, and the second mode is an idle mode. A power generation unit generates a first power level or a second power level that is less than the first power level, in response to the power control signal, to provide power to the semiconductor memory. The first power level is provided to the semiconductor memory before the semiconductor memory enters the first mode.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Embodiments of the invention will now be described with reference to the attached drawings.

Embodiment 1

Figure 1:
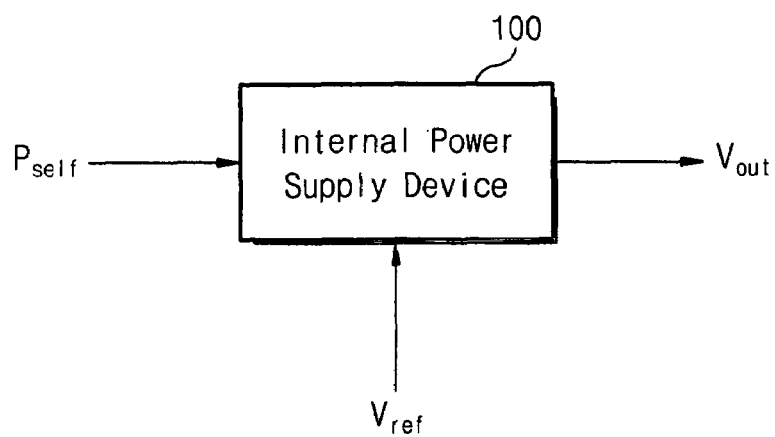
FIG. 1 illustrates the input and output signals for the case of a self-refresh operation in a general power supply device used in conventional semiconductor memory.
Figure 2:
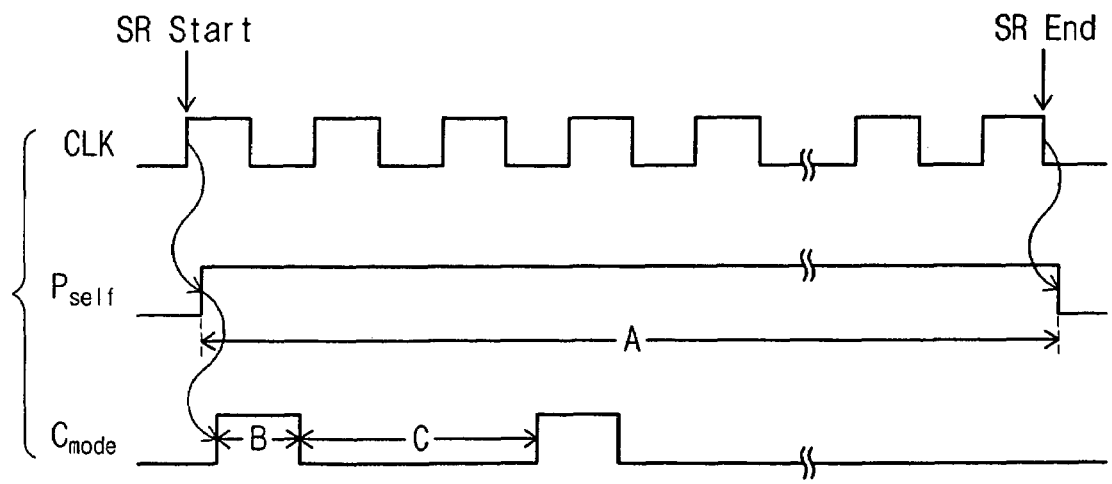
FIG. 2 is a waveform diagram of signals of the conventional power supply device shown in FIG. 1.
Figure 3:
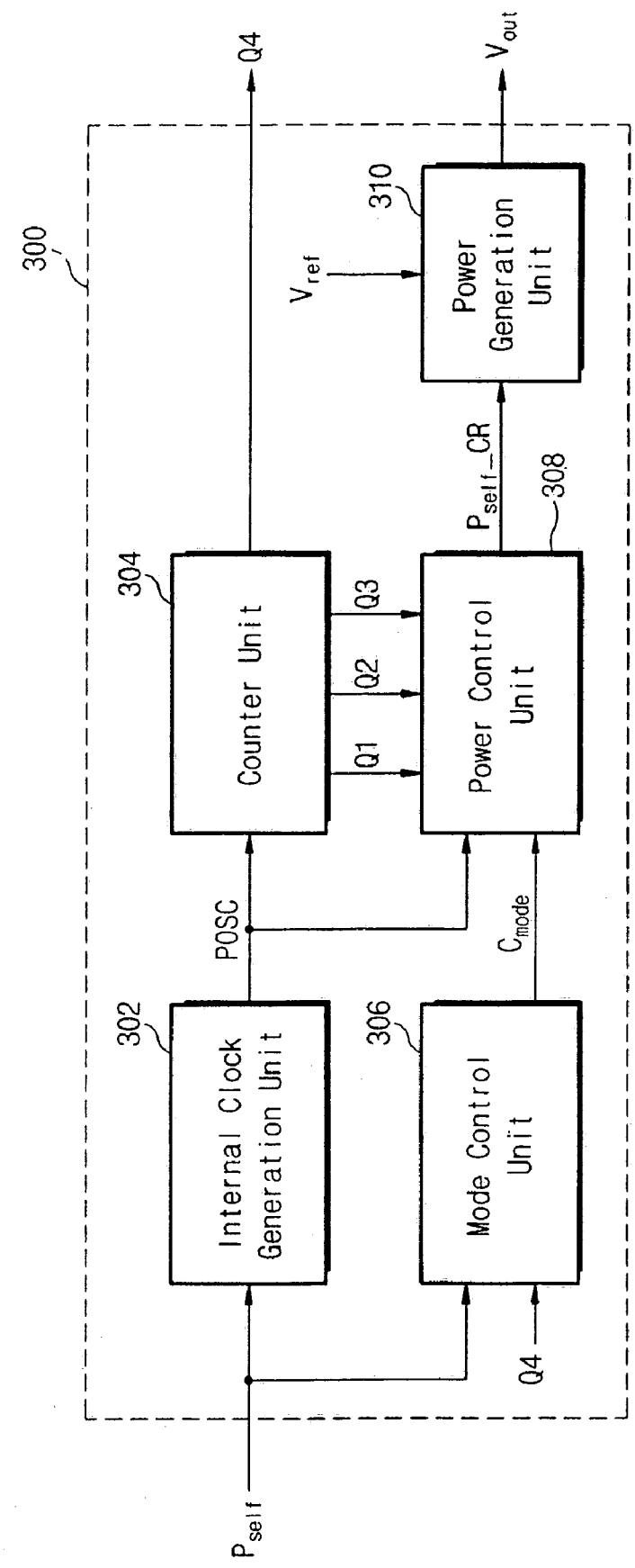
FIG. 3 is a block diagram of an embodiment of a power supply device according to the present invention.

FIG. 3 is a block diagram of an embodiment of a power supply device according to the present invention. The power supply device 300 of the present invention includes an internal clock generation unit 302, a counter unit 304, a mode control unit 306, a power control unit 308 and a power generation unit 310.

The internal clock generation unit 302 generates an internal clock signal POSC having a regular cycle during a self-refresh section of a semiconductor memory device operation in response to an externally input self-refresh cycle signal $P_{self}$.

The counter unit 304 receives the internal clock signal POSC from the internal clock generation unit 302 and generates division clocks Q1, Q2, Q3 and Q4. In another approach, the division clocks Q1, Q2, Q3 and Q4 are sequentially generated by dividing, for example dividing-by-two, the internal clock signal POSC, Q1, Q2 and Q3, respectively.

A mode control unit 306 generates a control signal $C_{mode}$ for controlling the operation of the semiconductor memory during the self-refresh cycle in response to the self refresh cycle signal $P_{self}$ and the division clock Q4. In other words, the mode signal $C_{mode}$ divides the operation of the semiconductor memory during the self-refresh cycle into an active-precharge mode and an idle mode, and thereby controls the operation of the semiconductor memory.

The power control unit 308 generates a power control signal $P_{self\_}CR$ for controlling the level of power output by the power generation unit 310 in response to the division clocks Q1, Q2, Q3 and Q4 and the mode control signal $C_{mode}$. The power control signal $P_{self\_}CR$ enhances output power by controlling an output of the power generation unit 310 before the semiconductor memory device enters into active precharge mode. As a result, the power control signal $P_{self\_}CR$ supports stable operation of the semiconductor memory device.

The power generation unit 310 provides different power strength, or voltage supply levels, to the semiconductor memory, in response to the power control signal $P_{self\_}CR$. The power generation unit 310 comprises, in one embodiment, a general differential amplifier.

Figure 4:
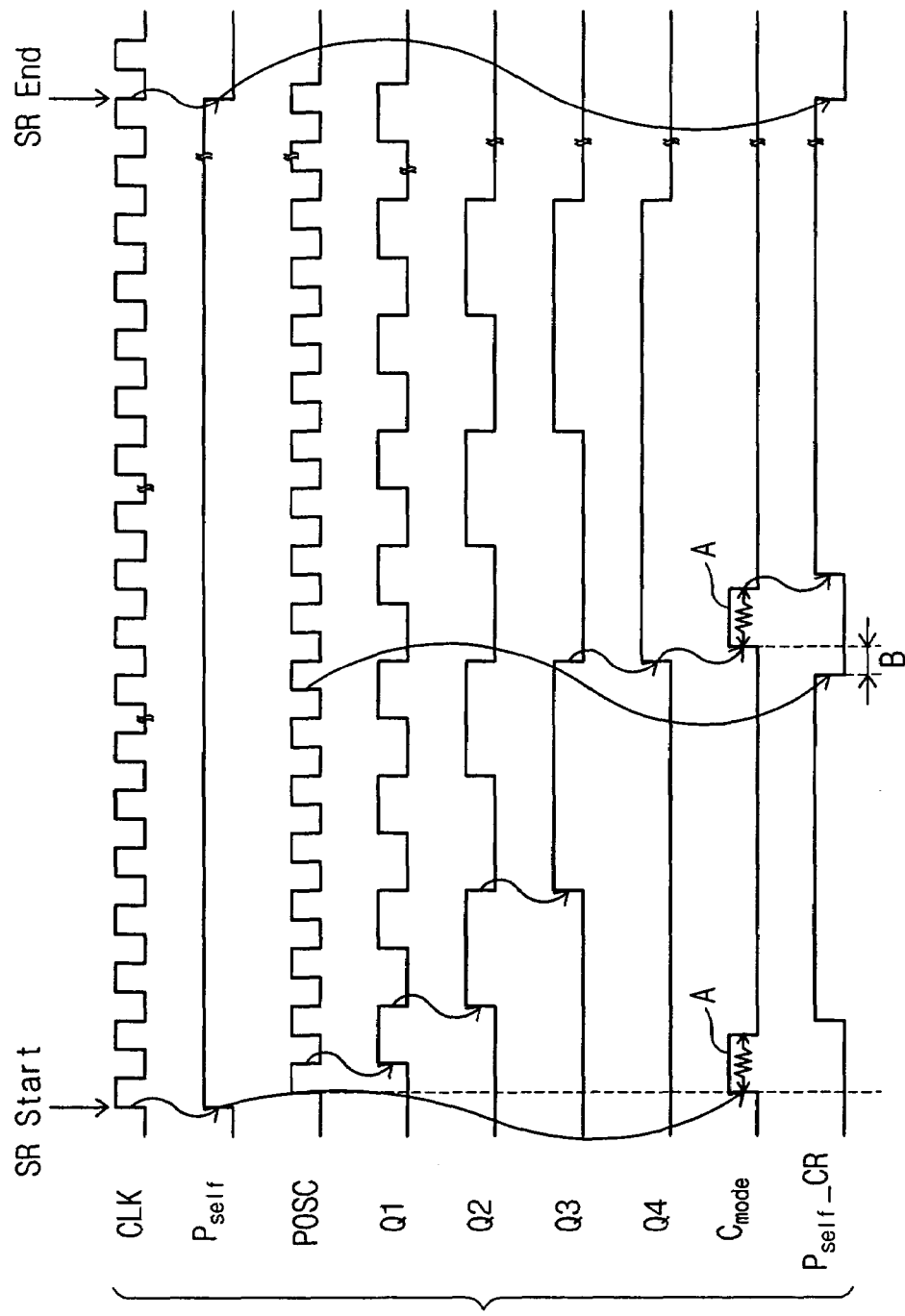
FIG. 4 is a waveform diagram of input and output signals for the power supply device of FIG. 3, in accordance with the present invention.

FIG. 4 is a waveform diagram of signals in the power supply device of the present invention shown in FIG. 3. The operation of the power supply device of the present invention is now more fully described referring to FIG. 4.

The internal clock signal POSC is generated by the internal clock generation unit 302 the self-refresh section of the semiconductor memory operation. The counter unit 304 divides the internal clock signal POSC by two to generate the division clock Q1. Division clock Q1 is in turn divided by two to generate the division clock signal Q2. Division clock Q2 is in turn divided by two to generate the division clock signal Q3. Division clock Q3 is in turn divided by two to generate the division clock signal Q4. In addition, the mode control signal $C_{mode}$ initially becomes activated in response to the self-refresh cycle signal $P_{self}$. Then, the mode control signal $C_{mode}$ becomes activated again in response to the division clock Q4. In this embodiment, the mode control signal $C_{mode}$ is an automatic pulse signal of a predetermined duration. In this case, the pulse signal becomes activated in response to an external signal $P_{self}$, and then becomes automatically deactivated following a predetermined time interval. When the self-refresh operation is performed, the semiconductor memory is placed in the active-precharge mode during section A, when the pulse signal is activated. Otherwise, the semiconductor memory is placed in the idle mode following activation of the pulse signal.

At the same time, as mentioned above, in the case where the semiconductor memory is operating under an active-precharge mode through the power generation unit 310, the power supply device 300 of the present invention provides sufficient power to the semiconductor memory. Also, in the case where the semiconductor memory is operating under the idle mode, the power supply device provides a relatively weak power level to the semiconductor memory for the purpose of reducing power consumption. Furthermore, the power supply device 300 enhances the supplied power level for a predetermined time period B in advance of changing the operation of the semiconductor memory to the active-precharge mode. To achieve this operation, the power control unit 308 generates the power control signal $P_{self\_}CR$ for controlling the output of the power generation unit 310 in response to the internal clock signal POSC, the divided clock signals Q1, Q2 and Q3 and the mode control signal $C_{mode}$.

Figure 5:
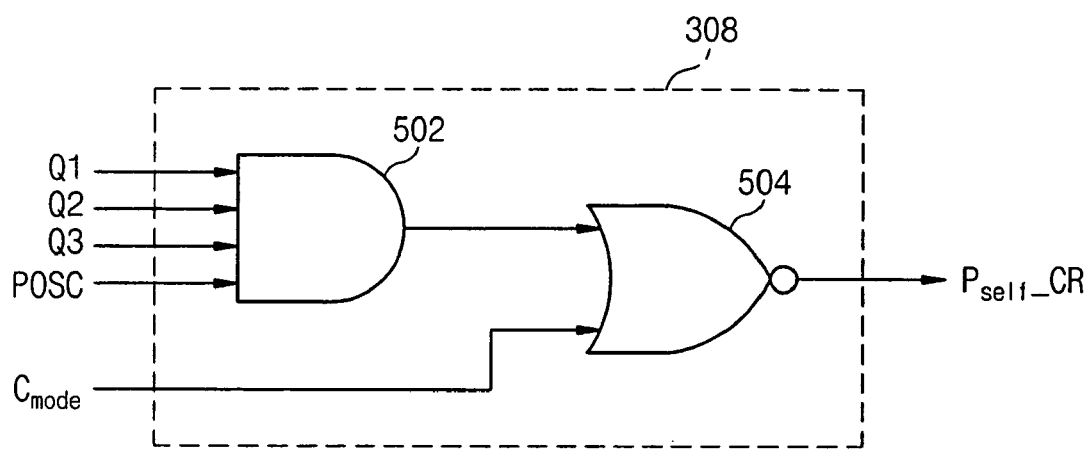
FIG. 5 is a circuit diagram of an embodiment of a power control unit according to the present invention.

FIG. 5 is a circuit diagram of an embodiment of the power control unit according to the present invention. As shown in FIG. 5, the power control unit 308 includes an AND gate 502 for receiving the internal clock signal POSC and the division clocks Q1, Q2 and Q3 and for performing an AND operation. An output of the AND gate 502 and the mode control signal $C_{mode}$ are presented to a NOR gate 404 for performing a NOR operation to produce the power control signal $P_{self\_}CR$. Referring to FIGS. 4 and 5, the power control signal $P_{self\_}CR$ becomes activated (active-low in this example) only in a section where the internal clock signal POSC and the division clocks Q1, Q2 and Q3 are all high (or active) or where the mode control signal $C_{mode}$ is high. As shown in FIG. 4, the power control signal $P_{self\_}CR$ becomes activated during a section of the timing sequence where the active-precharge operation has ended, for a predetermined time B prior to the next active precharge operation (indicated by 'A').

Figure 6:
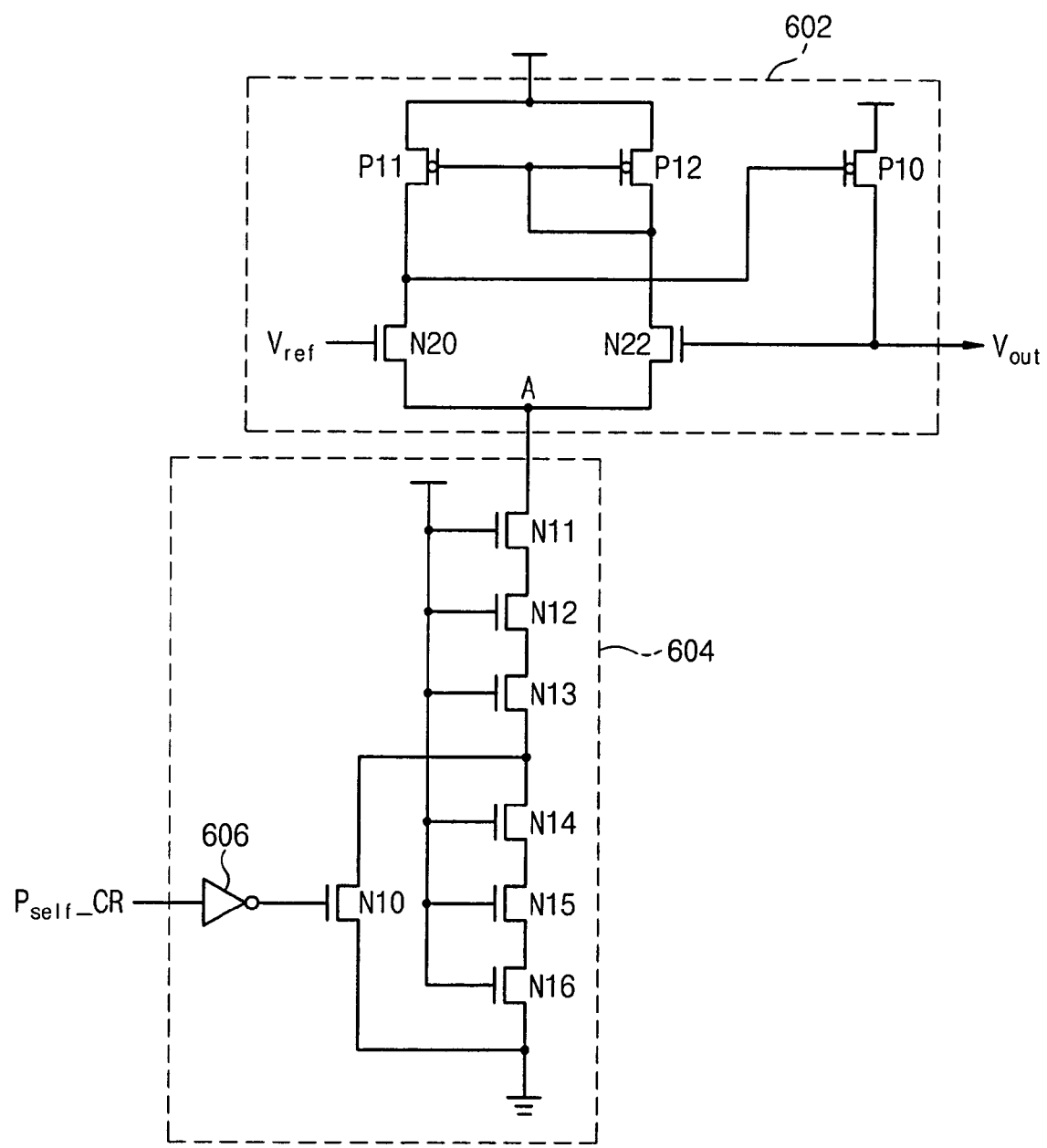
FIG. 6 is a circuit diagram of an embodiment of a power generation unit according to the present invention.

FIG. 6 is a circuit diagram showing an embodiment of the power generation unit 310 according to the present invention. As shown in FIG. 6, the power generation unit 310 is embodied as a differential amplifier. The power generation unit 310 includes a comparator 602 and a control unit 604. The comparator 602 compares a reference voltage $V_{ref}$ input from the from an external source, to generate an output voltage $V_{out}$ that is the same level as the reference voltage $V_{ref}$. The control unit 604 controls a response speed of the comparator 602, in response to the power control signal $P_{self\_}CR$. The comparator is well known component of a general differential amplifier and hence description of its operation is thus omitted.

The control unit 604 includes a plurality of NMOS transistors N10, N11-N16. The NMOS transistors N11~N16 are connected in series between a node A of the comparator 602 and a ground voltage. The NMOS transistor N10 is connected between a source of the NMOS transistor N14 and the ground voltage, and receives as an input at its gate, a power control signal $P_{self\_}CR$, inverted by an inverter 606.

In a section of operation where the power control signal $P_{self\_}CR$ is high, or inactive, the NMOS transistor N10 is cut off, so that a plurality of NMOS transistors N11~N16 all become connected in a series. Therefore, the overall resistance value of the control unit 604 becomes increased. When the resistance value of the control unit 604 is increased, the response speed with respect to the reference voltage $V_{ref}$ becomes decreased so that relatively weak power is output. In a section of operation where the power control signal $P_{self\_}CR$ is low, or active, the NMOS transistor N10 is turned on. As a result, the drain electrode of the NMOS transistor N13 is connected the ground voltage through the N10 transistor, so that entire resistance value of the control unit 604 becomes reduced. If the resistance value of the control unit 604 is reduced, the response speed of the output voltage $V_{out}$ becomes relatively fast with respect to the reference voltage $V_{ref}$ of the comparator 602. As a result, relatively strong power is output.

As mentioned above, the power supply device according to the present invention provides power stably for the refresh operation during the self-refresh cycle of the semiconductor memory. Furthermore, there is an advantage to efficiently reduce unnecessary power dissipation of the semiconductor memory during the self-refresh cycle.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A power supply device comprising:
 a power control unit for generating a power control signal so as to control an output power of the power supply device in response to an operation mode of an external device;
 a power generation unit for generating a first power level or a second power level that is less than the first power level, in response to the power control signal, to provide power to the external device, wherein the first power level at a higher power level than the second power level is provided to the external device for a predetermined time before the external device enters a first mode of operation that requires the first power level at the higher power level than the second power level;

an internal clock generation unit for generating an internal clock signal having a regular period during an operation section of the external device including the first mode of operation and a second mode of operation;

a counter unit for generating first, second, third and fourth clock signals in response to the internal clock signal; and a mode control unit for generating a mode signal for partitioning the operation section into the first mode and the second mode in response to the fourth clock signal, wherein the power control unit generates the power control signal in response to the internal clock signal, the first, second, and third clock signals and the mode signal.

2. The device as claimed in claim 1, wherein the counter unit divides the internal clock signal, the first clock signal, the second clock signal and the third clock signal to generate the first clock signal, the second clock signal, the third clock signal and the fourth clock signal, respectively.

3. The device as claimed in claim 2, wherein the counter unit divides-by-two the internal clock signal and the first, second and third clock signals.

4. The device as claimed in claim 1, wherein the first power level is provided to the external device before the external device enters into the first mode of operation, and wherein the second power level is provided to the external device during the second mode of operation.

5. The device as claimed in claim 1, wherein, when an operation mode of the external device begins, the mode control unit generates a pulse signal, and wherein the mode control unit generates the pulse signal in response to the fourth clock signal to generate the mode signal.

6. The device as claimed in claim 5, wherein the external device operates in the first mode of operation during a section where the pulse signal is activated.

7. The device as claimed in claim 1, wherein the first power is output when the internal clock signal and the first, second and third clock signals are all active, or if the pulse signal is active.

8. The device as claimed in claim 1, wherein the power control unit comprises:
an AND gate for receiving the internal clock signal and the first, second and third clock signals; and
a NOR gate for receiving an output of the AND gate and the pulse signal to generate the power control signal.

9. A power supply device comprising:
a power control unit for generating a power control signal so as to control an output power of the power supply device in response to an operation mode of an external device; and
a power generation unit for generating a first power level or a second power level that is less than the first power level, in response to the power control signal, to provide power to the external device, wherein the first power level at a higher power level than the second power level is provided to the external device for a predetermined time before the external device enters a first mode of operation that requires the first power level at the higher power level than the second power level, wherein the power generation unit comprises:
a comparator for comparing a reference voltage input from an external source to generate at a voltage level that is the same as that of the reference voltage; and
a control unit connected between the comparator and a ground voltage, the control unit for controlling an operation speed of the comparator in response to the power control signal.

10. The device as claimed in claim 9, wherein the power generation unit comprises a differential amplifier.

11. The device as claimed in claim 9, wherein the control unit comprises:
a plurality of NMOS transistors connected in series between the comparator and the ground voltage; and
a resistance controller for bypassing a subset of the plurality of NMOS transistors, in response to the power control signal.

12. The device as claimed in claim 11, wherein the resistance controller comprises:
an inverter for inverting the power control signal; and
an NMOS transistor that is activated in response to an output of the inverter.

13. A power supply device of a semiconductor memory comprising:
a power control unit for generating a power control signal for designating an operation of the semiconductor memory into a first mode and a second mode depending on a power dissipation characteristic, the power control unit for controlling a power level supplied to the semiconductor memory in each of the first mode and the second mode, wherein operation in the second mode is relatively more conservative than operation in the first mode in an amount of power dissipation;

a power generation unit for generating a first power level or a second power level that is less than the first power level, in response to the power control signal to provide power to the semiconductor memory, wherein the first power level at a higher power level than the second power level is provided to the semiconductor memory for a predetermined time before the semiconductor memory enters the first mode that requires the first power level at the higher power level than the second power level;

an internal clock generation unit for generating an internal clock signal having a regular period during an operation section of the semiconductor memory including the first mode of operation and the second mode of operation;

a counter unit for generating first, second, third and fourth clock signals in response to the internal clock signal; and a mode control unit for generating a mode signal for partitioning the operation section into the first mode and the second mode in response to the fourth clock signal, wherein the power control unit generates the power control signal in response to the internal clock signal, the first, second, and third clock signals and the mode signal.

14. The device as claimed in claim 13, wherein the counter unit divides the internal clock signal, the first clock signal, the second clock signal and the third clock signal to generate the first clock signal, the second clock signal, the third clock signal and the fourth clock signal, respectively.

15. The device as claimed in claim 14, wherein the counter unit divides-by-two the internal clock signal and the first, second and third clock signals.

16. The device as claimed in claim 15, wherein the fourth clock signal is a cyclic signal of the first mode.

17. The device as claimed in claim 13, wherein when an operation mode of the external device begins, the mode control unit generates a pulse signal, and wherein the mode control unit generates the pulse signal in response to the fourth clock signal to generate the mode signal.

18. The device as claimed in claim 17, wherein the first power is output when the internal clock signal and the first, second and third clock signals are all active, or if the pulse signal is active.

19. The device as claimed in claim 13, wherein the power control unit comprises:
   an AND gate for receiving the internal clock signal and the first, second and third clock signals; and
   a NOR gate for receiving an output of the AND gate and the mode signal to generate the power control signal.

20. A power supply device of a semiconductor memory comprising:
   a power control unit for generating a power control signal for designating an operation of the semiconductor memory into a first mode and a second mode depending on a power dissipation characteristic, the power control unit for controlling a power level supplied to the semiconductor memory in each of the first mode and the second mode, wherein operation in the second mode is relatively more conservative than operation in the first mode in an amount of power dissipation; and
   a power generation unit for generating a first power level or a second power level that is less than the first power level, in response to the power control signal to provide power to the semiconductor memory, wherein the first power level at a higher power level than the second power level is provided to the semiconductor memory for a predetermined time before the semiconductor memory enters the first mode that requires the first power level at the higher power level than the second power level, wherein the power generation unit comprises:
      a comparator for comparing a reference voltage input from an external source to generate at a voltage level that is the same as that of the reference voltage; and
      a control unit connected between the comparator and a ground voltage, the control unit for controlling an operation speed of the comparator in response to the power control signal.

21. The device as claimed in claim 20, wherein the power generation unit comprises a differential amplifier.

22. The device as claimed in claim 20, wherein the control unit comprises:
   a plurality of NMOS transistors connected in series between the comparator and the ground voltage; and
   a resistance controller for bypassing a subset of the plurality of NMOS transistors, in response to the power control signal.

23. The device as claimed in claim 22, wherein the resistance controller comprises:
   an inverter for inverting the control signal; and
   an NMOS transistor that is activated in response to an output of the inverter.

24. A power supply device of a semiconductor memory for performing a self-refresh operation comprising:
   a power control unit for designating the self-refresh operation into a first mode of operation and a second mode of operation, the power control unit for generating a power control signal to control power level supplied to the semiconductor memory in each of the first mode of operation and the second mode of operation, wherein an active-precharge operation of a refresh operation is performed in the first mode of operation, and wherein the second mode of operation is an idle mode; and
   a power generation unit for generating a first power level or a second power level which is less than the first power level, in response to the power control signal to provide power to the semiconductor memory, wherein the first power level at a higher power level than then second power level is provided to the semiconductor memory for a predetermined time before the semiconductor memory enters the first mode of operation;
   an internal clock generation unit for generating an internal clock signal having a regular period during an operation section of the semiconductor memory including the first mode of operation and a second mode of operation;
   a counter unit for generating first, second, third and fourth clock signals in response to the internal clock signal; and
   a mode control unit for generating a pulse signal when the self-refresh operation begins, and for generating the pulse signal in response to the fourth clock signal, wherein the power control unit generates the power control signal in response to the internal clock signal, the first, second, and third clock signals and the mode signal.

25. The device as claimed in claim 24, wherein the counter unit divides the internal clock signal, the first clock signal, the second clock signal and the third clock signal to generate the first clock signal, the second clock signal, the third clock signal and the fourth clock signal, respectively.

26. The device as claimed in claim 25, wherein the counter unit divides-by-two the internal clock signal and the first, second and third clock signals.

27. The device as claimed in claim 24, wherein the fourth clock signal is a cyclic signal of the first mode.

28. The device as claimed in claim 24, wherein the first power is output when the internal clock signal and the first, second and third clock signals are all active, or if the pulse signal is active.

29. The device as claimed in claim 24, wherein the power control unit comprises:
   an AND gate for receiving the internal clock signal and the first, second and third clock signals; and
   a NOR gate for receiving an output of the AND gate and the pulse signal to generate the power control signal.

30. A power supply device of a semiconductor memory for performing a self-refresh operation comprising:
   a power control unit for designating the self-refresh operation into a first mode of operation and a second mode of operation, the power control unit for generating a power control signal to control power level supplied to the semiconductor memory in each of the first mode of operation and the second mode of operation, wherein an active-precharge operation of a refresh operation is performed in the first mode of operation, and wherein the second mode of operation is an idle mode; and
   a power generation unit for generating a first power level or a second power level which is less than the first power level, in response to the power control signal to provide power to the semiconductor memory, wherein the first power level at a higher power level than then second power level is provided to the semiconductor memory for a predetermined time before the semiconductor memory enters the first mode of operation, wherein the power generation unit comprises:
      a comparator for comparing a reference voltage input from an external source to generate at a voltage level that is the same as that of the reference voltage; and a control unit connected between the comparator and a ground voltage, the control unit for controlling an operation speed of the comparator in response to the power control signal.

31. The device as claimed in claim 30, wherein the power generation unit comprises a differential amplifier.

32. The device as claimed in claim 30, wherein the control unit comprises:
a plurality of NMOS transistors connected in series between the comparator and the ground voltage; and
a resistance controller for bypassing a subset of the plurality of NMOS transistors, in response to the power control signal.

33. The device as claimed in claim 32, wherein the resistance controller comprises:
an inverter for inverting the power control signal; and
an NMOS transistor that is activated in response to an output of the inverter.

* * * * *